US008560901B2

(12) United States Patent
Seol et al.

(10) Patent No.: US 8,560,901 B2
(45) Date of Patent: Oct. 15, 2013

(54) APPARATUS, METHOD AND MEMORY DEVICE FOR ERROR CORRECTION BY INCREASING OR DECREASING A READ VOLTAGE AND ANALYZING FREQUENCY INFORMATION FOR A READ ERROR PATTERN

(75) Inventors: Kwang Soo Seol, Yongin-si (KR); Sung II Park, Suwon-si (KR); Kyoung Lae Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1043 days.

(21) Appl. No.: 12/453,813

(22) Filed: May 22, 2009

(65) Prior Publication Data
US 2009/0292972 A1    Nov. 26, 2009

(30) Foreign Application Priority Data

May 23, 2008    (KR) .................. 10-2008-0048264

(51) Int. Cl.
*G06F 11/00* (2006.01)
*G06F 11/10* (2006.01)

(52) U.S. Cl.
USPC ........ 714/721; 714/25; 714/723; 365/185.03; 365/185.24

(58) Field of Classification Search
USPC ........... 714/25, 32, 37, 721, 723; 365/185.03, 365/185.24
See application file for complete search history.

(56) References Cited

U.S. PATENT DOCUMENTS

| 5,355,167 | A  | * | 10/1994 | Juri ........................ 375/240.03 |
| 7,746,703 | B2 | * | 6/2010  | Kim et al. ................ 365/185.28 |
| 7,773,022 | B2 | * | 8/2010  | Cornwell et al. ............ 341/156 |
| 7,787,302 | B2 | * | 8/2010  | Park et al. ................ 365/185.18 |
| 2006/0233279 | A1 | * | 10/2006 | Ryder et al. ................. 375/296 |
| 2007/0047327 | A1 | * | 3/2007  | Goda et al. ............... 365/185.29 |
| 2007/0174740 | A1 | * | 7/2007  | Kanno ............................ 714/54 |
| 2008/0263266 | A1 | * | 10/2008 | Sharon et al. ................ 711/103 |
| 2008/0279007 | A1 | * | 11/2008 | Dong et al. ............. 365/185.17 |
| 2009/0003058 | A1 | * | 1/2009  | Kang ..................... 365/185.03 |

FOREIGN PATENT DOCUMENTS

| JP | 2007-207343    | 8/2007 |
| KR | 10-2003-0009056 | 1/2003 |
| KR | 10-2006-0067955 | 6/2006 |

OTHER PUBLICATIONS

Wikipedia's Multi-level cell http://en.wikipedia.org/wiki/Multi-level_cell retrieved Dec. 19, 2011.*

* cited by examiner

*Primary Examiner* — Joseph Schell
(74) *Attorney, Agent, or Firm* — Harness, Dickey & Pierce, P.L.C.

(57) ABSTRACT

An error correction apparatus, a method thereof, and a memory device including the apparatus are provided. The error correction apparatus may include: a determination unit configured to determine whether a number of errors in a read word being read and extracted from a multi-level cell (MLC) exists in an error correcting capability range; a read voltage control unit configured to either increase or decrease a read voltage applied to the MLC when the number of errors in the read word is outside the error correcting capability range; and a codeword determination unit configured to analyze a bit error based on the increase or decrease of the read voltage, and to select a codeword corresponding to the analyzed bit error based on a selected read error pattern. Through this, it may be possible to efficiently correct a read error that occurs when the data of the memory device is maintained for a long time.

13 Claims, 7 Drawing Sheets

APPARATUS, METHOD AND MEMORY DEVICE FOR ERROR CORRECTION BY INCREASING OR DECREASING A READ VOLTAGE AND ANALYZING FREQUENCY INFORMATION FOR A READ ERROR PATTERN

PRIORITY STATEMENT

This application claims priority under 35 U.S.C. §119 to Korean Patent Application No. 10-2008-0048264, filed on May 23, 2008, in the Korean Intellectual Property Office (KIPO), the entire contents of which are incorporated herein by reference.

BACKGROUND

1. Field

Example embodiments relate to methods that may correct read errors of data of memory devices. Also, example embodiments relate to apparatuses and/or methods that may correct errors of read data of multi-level cell (MLC) memory devices or multi-bit cell (MBC) memory devices.

2. Description of Related Art

Recently, a multi-level cell (MLC) memory device that may store data of two or more bits in a single memory cell has been proposed in response to a need for higher integration of memory. The MLC memory device may also be referred to as a multi-bit cell (MBC) memory. However, as the number of bits programmed in the single memory cell increases, reliability may deteriorate and a read-failure rate may increase. To program 'm' bits in the single memory cell, any one of $2^m$ threshold voltages may need to be generated in the memory cell. Threshold voltages of memory cells where the same data is programmed may generate a distribution within a predetermined range due to the minute electrical characteristic difference between the memory cells. Each threshold voltage distribution may correspond to one of $2^m$ data values generated by 'm' bits.

However, since a voltage window for a memory device may be limited, a distance between $2^m$ distributions of threshold voltages between adjacent bits may decrease as 'm' increases, and the distributions may be overlapped as the distance between the distributions decreases. When the distributions are overlapped, the read-failure rate may increase.

As the MLC memory device has been widely and recently used, error control codes or error control coding or error correction codes (ECC) that may detect an error occurring when storing and reading the data and correct the detected error have been actively used.

When the data is maintained for a long time, due to a lateral movement of a charge which may be caused by an electrostatic attractive force between the charge stored in the memory cell and the charge stored in an adjacent cell, a charge trap memory including a multi-level cell may need to efficiently correct a read error.

SUMMARY

Example embodiments may provide apparatuses and/or methods that may select a codeword corresponding to a read word based on a selected read error pattern when the read word being read and extracted from a multi-level cell (MLC) is outside an error correcting capability range.

Example embodiments may also provide apparatuses and/or methods that may manage, in parallel, error correction codes (ECC) and a read error pattern having a high probability that a read error occurs, thereby effectively correcting the read error that may occur due to a lateral charge movement between adjacent cells.

According to example embodiments, an error correction apparatus may include: a determination unit configured to determine whether a number of words in a read word being read and extracted from an MLC exists in an error correcting capability range; a read voltage control unit configured to either increase or decrease a read voltage applied to the MLC when the number of errors in the read word is outside the error correcting capability range; and a codeword determination unit configured to analyze a bit error based on the increase or decrease of the read voltage, and to select a codeword corresponding to the analyzed bit error based on a selected read error pattern.

According to example embodiments, a memory device may include: an MLC array including a plurality of MLCs; an error correction unit configured to analyze a bit error when a read word being read and extracted from an MLC is outside an error correcting capability range to select and decode a codeword with respect to the read word based on a selected read error pattern; and a host interface configured to transmit the decoded codeword to a host.

According to example embodiments, an error correction method may include: determining whether a number of errors in read word being read and extracted from an MLC exists in an error correcting capability range; either increasing or decreasing a read voltage applied to the MLC when the number of errors in the read word is outside the error correcting capability range; and analyzing a bit error based on the increase or decrease of the read voltage, and selecting a codeword corresponding to the analyzed bit error based on a selected read error pattern.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
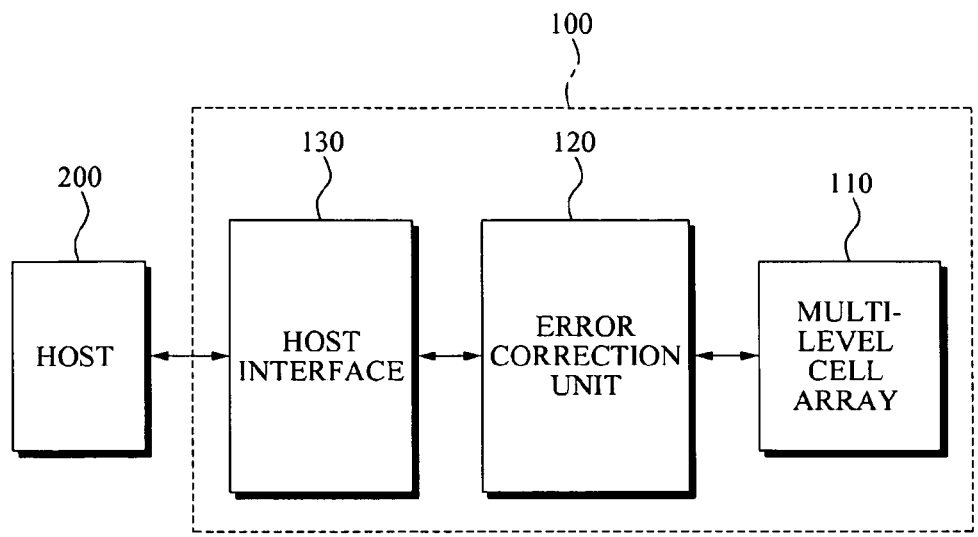
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will herein be described in detail. It should be understood, however, that there is not intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, for example "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, for example those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Reference will now be made to example embodiments, which are illustrated in the accompanying drawings, wherein like reference numerals may refer to like components throughout.

Hereinafter, an error correction apparatus, a method thereof, and a memory device including the apparatus according to example embodiments are described in detail with reference to the attached drawings. When detailed descriptions related to a well-known related function or configuration are determined to make the spirits of example embodiments ambiguous, the detailed descriptions will be omitted herein. Also, terms used throughout the present specification are used to appropriately describe example embodiments, and thus may be different depending upon a user and an operator's intention, or practices of application fields of example embodiments. Therefore, the terms must be defined based on descriptions made through example embodiments.

FIG. 1 is a block diagram illustrating a memory device 100 according to example embodiments.

Referring to FIG. 1, the memory device 100 may include a multi-level cell (MLC) array 110, an error correction unit 120, and a host interface 130.

The MLC array 110 may include a plurality of MLCs. A process of storing data in an MLC of a non-volatile memory including a flash memory, an Electrically Erasable Programmable Read Only Memory (EEPROM), and the like may be referred to as a programming process, and may correspond to a process of changing a threshold voltage of the MLC.

A process of programming the data in the MLC of the non-volatile memory may be performed by a mechanism including Fowler-Nordheim tunneling (F-N tunneling), a hot carrier effect, and the like. F-N tunneling may change the threshold voltage of the MLC. A single-bit cell may have a low threshold voltage level or a high threshold voltage level, and may express data of "0" or "1" using two threshold voltage levels.

In a Charge Trap Flash (CTF) memory device, the MLC array 110 may include an insulation layer including a charge trap site that may trap a charge.

A charge potential difference between adjacent cells may exist in the MLC. A lateral electric field may occur due to the potential difference, and the charge stored in a charge trap layer of the MLC may move in a word line direction.

When the charge stored in the charge trap layer moves in the word line direction, a threshold voltage of a programmed cell may gradually decrease, and the stored data may be lost, thereby deteriorating reliability of a memory.

In the charge trap layer, for example silicon nitride ($Si_3N_4$), mobility of the charge may change so that the charge moves non-linearly based on a strength of an electric field that may be applied to the charge trap layer, and as the strength of the electric field increases, charge mobility may increase non-linearly.

In a four-level MLC, a cell may have three levels of state 00, state 01, or state 10 as a programming state, and may have state 11 as a deletion state. Since the programming state may be classified into three states, a maximum of threshold voltages of the programming state may have is about 4.5 V, and may include a state from −2 V to −4 V as the deletion state. When the data is saved for a long time, a movement of most electrons stored in the cell to the adjacent cell may occur. Accordingly, the data may not maintain an initial input state.

Error correction codes (ECC) may be used for correcting an error that occurs when the data is read. A process of adding the ECC to initial data prior to storing the data in the MLC may be referred to as ECC encoding, and a process of separating added information and the initial information from the data being read and extracted from the MLC to restore the initial information may be referred to as ECC decoding.

Depending on ECC decoders, when a number of errors of an input codeword is less than or equal to the error correcting capability of an ECC code, all errors of the input codeword may be corrected. Block codes and the like may be examples of codes whose error correcting capability is explicitly shown. As examples of the block codes, there are Bose, Ray-Chaudhuri, Hocquenghem (BCH) codes, Reed-Solomon (RS) codes, and the like, and as examples of decoding schemes for the block codes, there are a Meggitt decoding scheme, a Berlekamp-Massey decoding scheme, and a Euclid decoding scheme, and the like.

However, when the number of errors of the input codeword is beyond the error correcting capability of an ECC code, the accurate and actual codeword may not be selected by a general ECC decoding scheme.

For this, the error correction unit 120 according to example embodiments may analyze a bit error when the number of errors in a read word being read and extracted from the MLC array 110 is outside an error correcting capability range to select and decode the codeword with respect to the read word based on a selected read error pattern.

The host interface 130 may transmit the decoded codeword to a host 200. The host 200 may include a controller of a mobile device, a controller of a computer apparatus, and the like. The host interface 130 may perform a control and buffering function for an interface between the host 200 and the MLC array 110.

The read error pattern may include a data error pattern that occurs corresponding to a data storage pattern between adjacent cells stored in the MLC.

The read error pattern may include the data error pattern that occurs due to a lateral electric field between the adjacent cells of the MLC array 110, and the data error pattern may correspond to a threshold voltage change of the MLC array 110 due to a lateral charge movement caused by the lateral electric field.

Hereinafter, referring to FIG. 2, the error correction unit 120 of FIG. 1 is described in detail.

Figure 2:
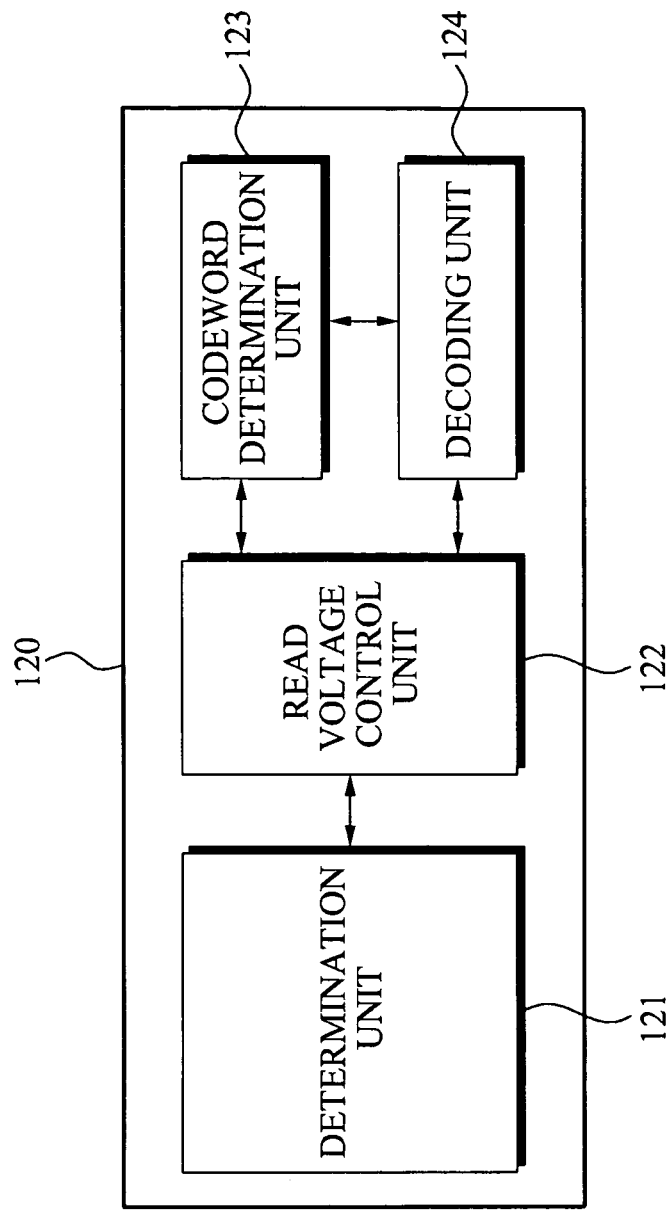
FIG. 2 is a block diagram illustrating a configuration of an error correction unit of FIG. 1.

FIG. 2 is a block diagram illustrating a configuration of the error correction unit 120 of FIG. 1.

Referring to FIG. 2, the error correction unit 120 may include a determination unit 121, a read voltage control unit 122, and a codeword determination unit 123.

The determination unit 121 may determine whether the number of errors in a read word being read and extracted from an MLC array 110 exists in an error correcting capability range.

The read voltage control unit 122 may either increase or decrease a read voltage applied to the MLC array 110 when the number of errors in a read word is outside the error correcting capability range. The read voltage control unit 122 may complete reading data at an initial read voltage, for example, V=1.0V, and may gradually increase or decrease the read voltage by ΔV, for example, 0.1~05.V, while reading data.

The codeword determination unit 123 may analyze the bit error based on the increase or decrease of the read voltage, and select the codeword with respect to the read word based on a selected read error pattern, the codeword corresponding to the analyzed bit error.

When a number of bit errors with respect to the analyzed bit error does not increase or decrease, the codeword determination unit 123 may select the codeword based on the read error pattern.

According to example embodiments, the codeword determination unit 123 may analyze frequency information about the read error pattern, and may select a codeword having a level of association with the read error pattern which is above a reference value or the maximum level of association. For example, the MLC array 110 may store data relating to the frequency with which different read error patterns occur for each codeword. With reference to a particular read error pattern, codeword determination unit 123 may choose a codeword for which the particular read error pattern has occurred more than a reference number of times, or codeword determination unit may choose a codeword for which the particular read error pattern has occurred a maximum number of times when compared to other codewords.

According to example embodiments, the codeword determination unit 123 may analyze a Hamming distance between the read word and each of a set of candidate codewords, and may select the codeword in which the analyzed Hamming distance is below a reference value or the minimum.

According to example embodiments, the MLC array 110 may store error pattern information about a weight of the read error pattern including data before encoding, and the codeword determination unit 123 may select the codeword based on at least one of the error pattern information and the analyzed Hamming distance.

The read error pattern according to example embodiments may include a data error pattern that occurs corresponding to a data storage pattern with respect to the data stored between adjacent cells of the MLC array 110.

According to example embodiments, the read error pattern may include the data error pattern that occurs due to a lateral electric field between the adjacent cells of the MLC array 110. The data error pattern may correspond to a threshold voltage change of the MLC array 110 due to a lateral charge movement caused by the lateral electric field, and the codeword determination unit 123 may select the codeword including the data error pattern.

The error correction unit 120 according to example embodiments may further include a decoding unit 124 configured to decode the selected codeword.

Hereinafter, referring to FIG. 3, an operation of the error correction unit 120 of FIG. 1 is described in detail.

Figure 3:
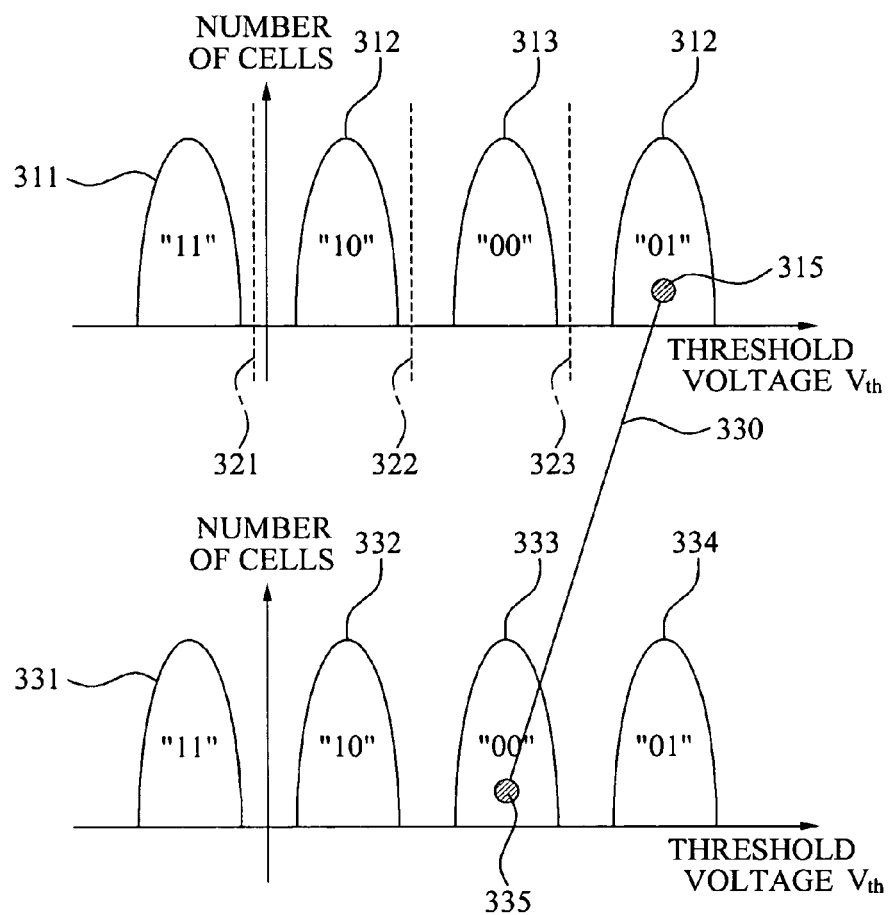
FIG. 3 illustrates an operation of the error correction unit of FIG. 1.

FIG. 3 illustrates the operation of the error correction unit 120 of FIG. 1.

Referring to FIG. 3, a relation between a threshold voltage and 2-bit data stored by MLCs is illustrated.

Threshold voltage distributions of the MLCs are shown as a number of the MLCs corresponding to each of the threshold voltages.

Since minute electrical differences between each of the MLCs exist, the threshold voltages of the MLCs may generate distributions with predetermined ranges.

A distribution 311 may denote the MLCs storing data "11".
A distribution 312 may denote the MLCs storing data "10".
A distribution 313 may denote the MLCs storing data "00".

A distribution 314 may denote the MLCs storing data "01".

The memory device 100 may decide a Most Significant Bit (MSB) stored in MLCs of a memory page using a second read voltage level 322. The memory device 100 may decide, as "0", the MSB stored in the MLCs having the threshold voltage higher than the second read voltage level 322, and may decide, as "1", the MSB stored in the MLCs having the threshold voltage lower than the second read voltage level 322.

The memory device 100 may decide a Least Significant Bit (LSB) stored in the MLCs of the memory page using a first read voltage level 321 and a third read voltage level 323. The memory device 100 may decide, as "1", the LSB stored in the MLCs having the threshold voltage lower than the first read voltage level 321. The memory device 100 may decide, as "1", the LSB stored in the MLCs having the threshold voltage higher than the third read voltage level 323. The memory device 100 may decide, as "0", the LSB stored in the MLCs having the threshold voltage being higher than the first read voltage level 321 and being lower than the third read voltage level 323.

A state 315 may denote that the threshold voltage of the identified MLC is included in the distribution 314 when programming data. The data programmed in the identified MLC may correspond to "01".

In a CTF memory device according to example embodiments, a charge stored in the MLC array 110 move laterally due to a lateral electric field between adjacent cells and may decrease or increase the threshold voltage. When having a data storage pattern of storing data of a highest level in a cell, for example, a state where the threshold voltage has a highest value, and storing data of a lowest level in an adjacent cell thereof, for example, a state where the threshold voltage has a lowest value, a lateral potential difference between the adjacent cells may become maximum, and a lateral charge movement may occur most actively.

In FIG. 3, when the data storage pattern between the adjacent cells of the MLC array 110 includes state "11" where the threshold voltage corresponds to a lowest level and state "01" where the threshold voltage corresponds to a highest level ('110111' or '011101'), the lateral charge movement may occur most easily.

An arrow 340 may denote a change of the threshold voltage of the identified MLC caused by the lateral charge movement occurring due to the lateral electric field.

A state 335 may denote that the threshold voltage of the identified MLC is included in a distribution 333 when the data is read and extracted. The data read from the identified MLC may correspond to "00".

The read voltage control unit 122 may either increase or decrease a read voltage applied to the MLC when the number of errors in the read word being read and extracted from the MLC is outside the error correcting capability range.

The codeword determination unit 123 may analyze the bit error based on the increase or decrease of the read voltage, and select the codeword with respect to the read word, the codeword corresponding to the analyzed bit error based on the read error pattern where an error including the above-described data storage pattern easily occurs.

As described above, the read error pattern may include a data error pattern that occurs corresponding to the data storage pattern with respect to the data stored between the adjacent cells of the MLC array 110. According to example embodiments, the read error pattern may include the data error pattern that occurs due to the lateral electric field between the adjacent cells of the MLC array 110. The data error pattern may correspond to a threshold voltage change of the MLC array 110 due to the lateral charge movement caused by the lateral electric field, and the codeword determination unit 123 may select the codeword including the data error pattern.

When a number of bit errors with respect to the analyzed bit error does not increase or decrease, the codeword determination unit 123 may select the codeword based on the read error pattern.

According to example embodiments, the codeword determination unit 123 may analyze frequency information about the read error pattern, and may select the codeword having a high or maximum level of association with the read error pattern.

According to example embodiments, the codeword determination unit 123 may analyze a Hamming distance between the read word and each of a set of candidate codewords, and may select the codeword in which the analyzed Hamming distance is below a reference value or the minimum. The Hamming distance may denote a number of corresponding bit values between binary codes having the same bit number, the bit values being different from each other.

According to example embodiments, the MLC array 110 may record, in a separate dummy cell, error pattern information about a weight of the read error pattern including data before encoding, and the codeword determination unit 123 may select the codeword based on at least one of the error pattern information and the analyzed Hamming distance. The codeword determination unit 123 may select a codeword in which the weight of the read error pattern is above a reference value or the highest and the Hamming distance is below a reference value or the minimum.

An example embodiment of FIG. 3 may denote a case where the MLCs in MLC array 110 store 2-bit data, however, example embodiments may be applied to a case where the MLCs store m-bit data (m>2).

Hereinafter, referring to FIGS. 4 and 5, an error correction method when a read word is outside an error correcting capability range is described in detail.

Figure 4:
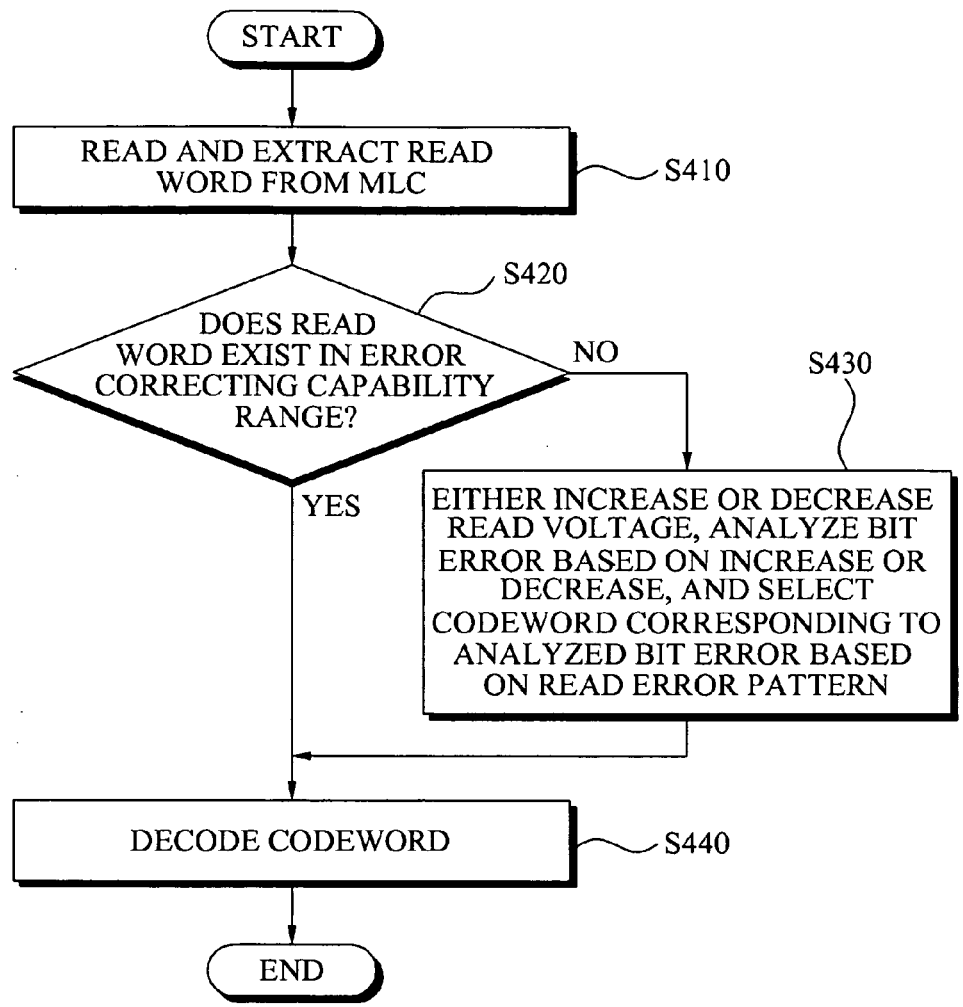
FIG. 4 is a flowchart illustrating a method of correcting a read error according to example embodiments.

FIG. 4 is a flowchart illustrating a method of correcting a read error according to example embodiments.

Referring to FIG. 4, in operation S410, the method of correcting the read error may include reading and extracting a read word from an MLC array.

In operation S420, the method may include determining whether the number of errors in the read word being read and extracted from the MLC array 110 exists in an error correcting capability range.

In operation S430, the method may include either increasing or decreasing a read voltage applied to the MLC array 110 when the number of errors in the read word is outside the error correcting capability range, analyzing a bit error based on the increase or decrease of the read voltage, and selecting a codeword corresponding to the analyzed bit error based on a selected read error pattern.

Hereinafter, referring to FIGS. 5A through 5C, operation 5430 is described in detail.

Figure 5A:
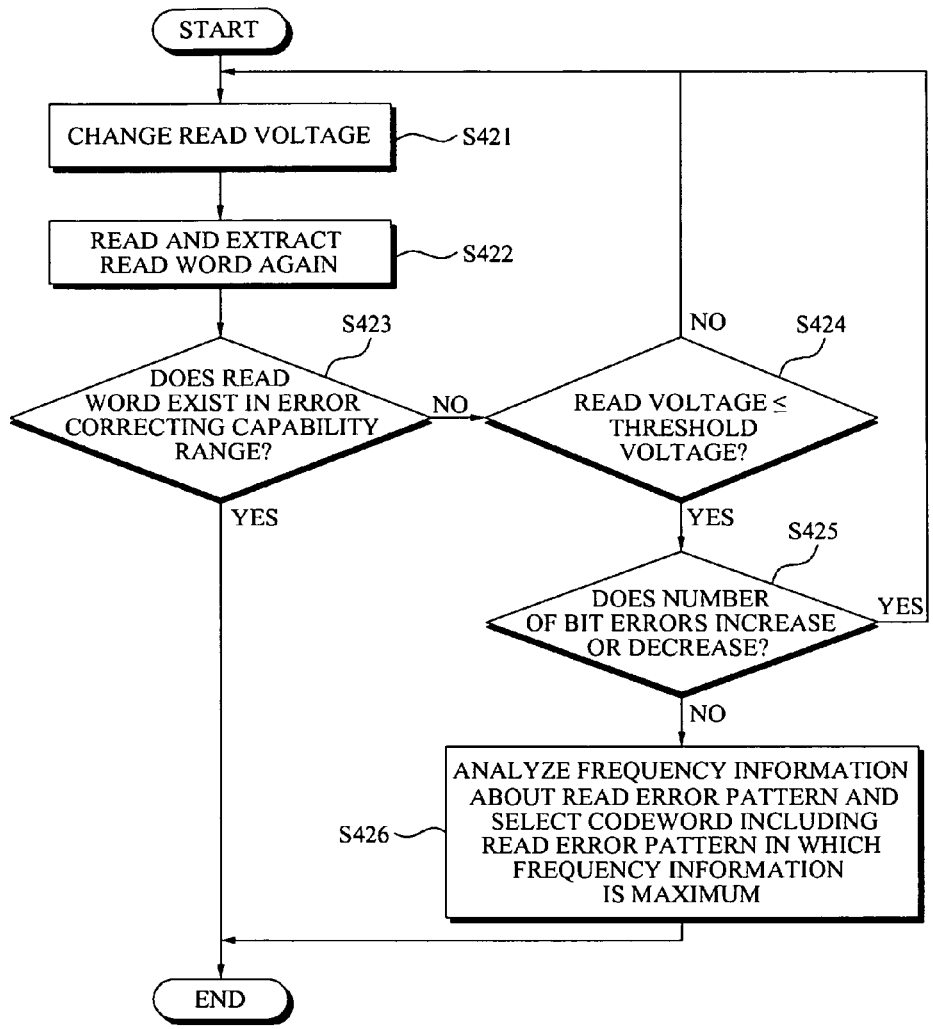
FIG. 5A is a flowchart illustrating a method of selecting a codeword based on a read error pattern to correct an error according to example embodiments.

FIG. 5A is a flowchart illustrating a method of selecting a codeword based on a read error pattern to correct an error according to example embodiments.

Referring to FIG. 5A, in operation S421, when the number of errors in the read word is outside the error correcting capability range in operation 5420, the method may include either increasing or decreasing a read voltage to change the read voltage.

In operation S422, the method may include reading and extracting the read word again. In operation S423, the method may include determining again whether the number of errors in the read word being read and extracted again exists in the error correcting capability range.

When the number of errors in the read word being read and extracted again exists in the error correcting capability range, the method may proceed to operation S440.

Alternatively, in operation S424, when the number of errors in the read word being read and extracted again is outside the error correcting capability range, the method may determine whether a read voltage applied to the MLC array 110 is lower than or equal to a threshold voltage. When the read voltage is higher than the threshold voltage, the method may proceed to operation S421, change the read voltage again, and determine whether the number of errors in the read word being read and extracted again exists in the error correcting capability range, and whether the changed read voltage is lower than or equal to the threshold voltage.

Alternatively, when the read voltage is lower than or equal to the threshold voltage in operation S424, the method may determine whether a number of bit errors increases or decreases in operation S425, and may proceed to operation 5426 only when the number of bit errors does not increase or decrease, which may indicate the number of bit errors is minimum.

When the number of bit errors increases or decreases, the method may include changing the read voltage again and repeating a process from operations S421 through S424.

In operation S426, when the number of bit errors does not increase or decrease, or the number of bit errors is below a reference value or at a minimum in operation S425, the method may include analyzing frequency information about the read error pattern, and selecting the codeword in which the frequency information is above a reference value or at a maximum. Since the codeword having a high or maximum level of association with the read error patterns may have a strong possibility of being the actual codeword compared with other candidate codewords, the method may selects the codeword in which the frequency information indicates a high or maximum level of association with the read error pattern.

Figure 5B:
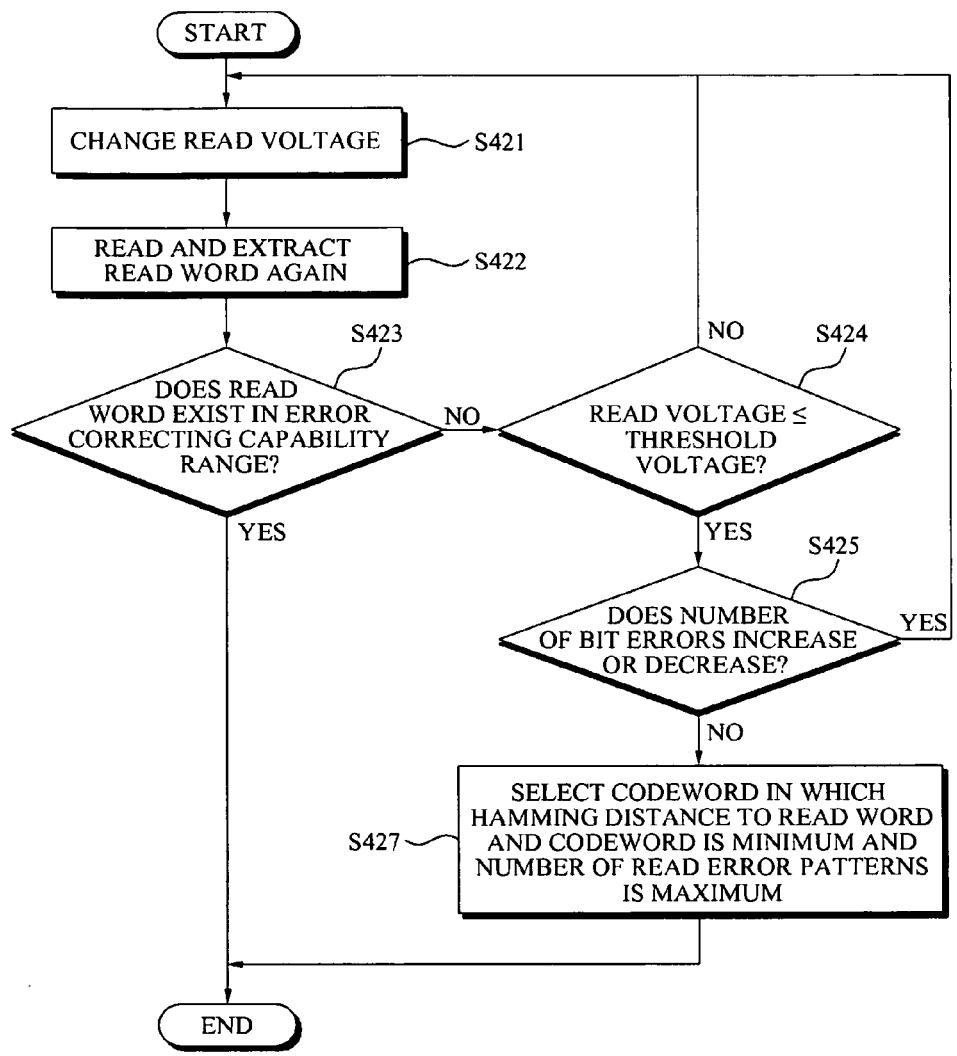
FIG. 5B is a flowchart illustrating another method of selecting a codeword based on a read error pattern to correct an error according to example embodiments.

FIG. 5B is a flowchart illustrating another method of selecting a codeword based on a read error pattern to correct an error according to example embodiments.

Referring to FIG. 5B, since a process from operations 5421 through S425 may be the same as FIG. 5A, descriptions thereof are omitted.

In operation S427, the method of selecting the codeword based on the read error pattern to correct the error according to example embodiments may include analyzing a Hamming distance between the read word being read and extracted again and each of a set of candidate codewords, and selecting the codeword for which the Hamming distance is below a reference value or the lowest of the candidate codewords, and level of association of the codeword with the read error pattern is above a reference level or the highest of the candidate codewords.

Figure 5C:
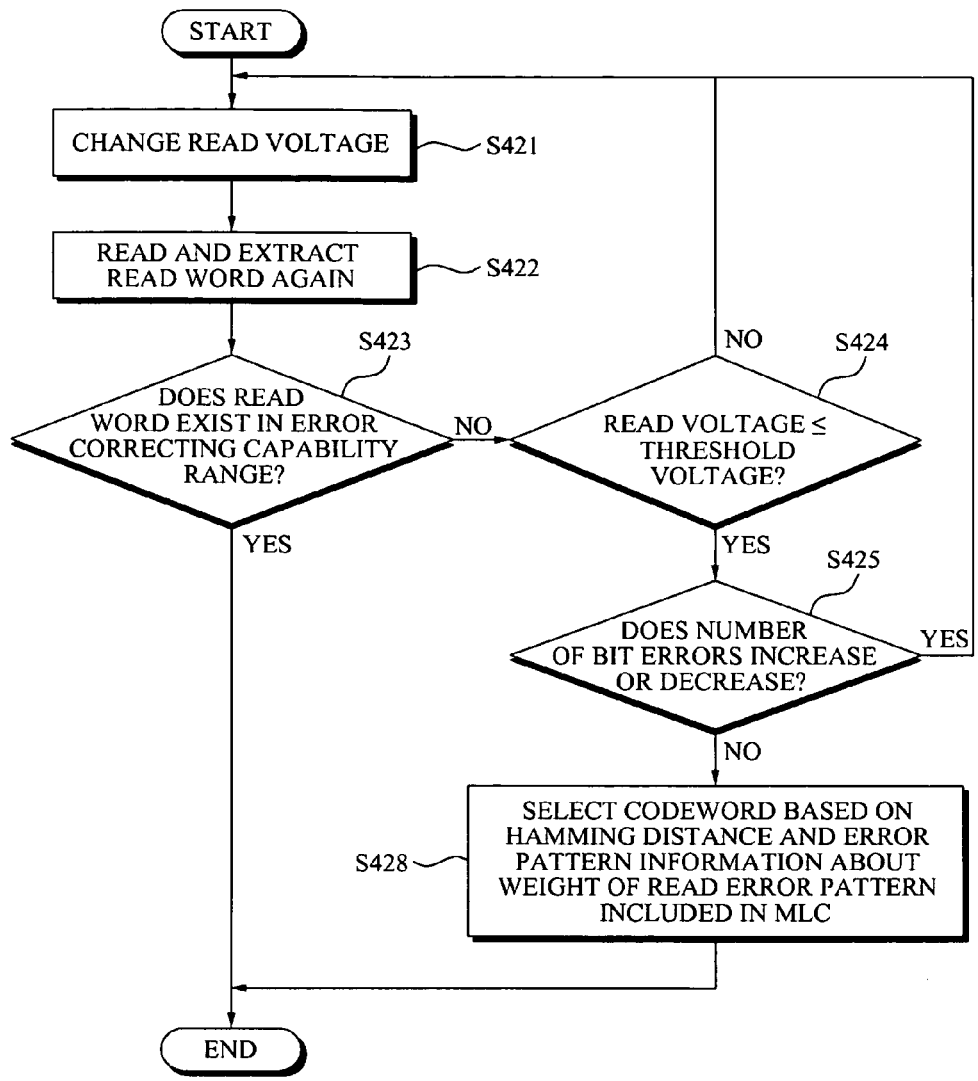
FIG. 5C is a flowchart illustrating still another method of selecting a codeword based on a read error pattern to correct an error according to example embodiments.

FIG. 5C is a flowchart illustrating still another method of selecting a codeword based on a read error pattern to correct an error according to example embodiments.

Referring to FIG. 5C, since a process from operations S421 through S425 may be the same as FIG. 5A, descriptions thereof are omitted.

In operation S428, the method of selecting the codeword based on the read error pattern to correct the error according to example embodiments may include selecting the codeword based on error pattern information about a weight of the read error pattern included in a dummy cell of an MLC array, and a Hamming distance analyzed by considering the read word being read and extracted again and the bit error. The method may include selecting the codeword in which the weight is above a reference level or highest from among a codeword group including codewords, from among the candidate codewords, having a Hamming distance that is below a reference value or lowest of the candidate codewords. The weight of the read error pattern may be based on frequency information about the read error pattern. For example, codewords for which a particular read error pattern has occurred many times may have a higher weight with respect to the particular read error pattern than codewords for which the particular read error pattern has occurred few times or no times.

Referring to FIG. 4 again, in operation S440, when the number of errors in the read word exists in the error correcting capability range in operation S420, the method may include decoding the codeword corresponding to the read word to output the codeword, and decoding the codeword selected based on the read error pattern in operation S430 to output the codeword.

The error correction method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions include both machine code, for example produced by a compiler, and files containing higher level code that may be executed by the computer using an interpreter. The described hardware devices may be configured to act as one or more software modules in order to perform the operations of example embodiments.

Memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. For example, the memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An error correction circuit comprising:
a determination unit configured to determine whether a number of errors in a read word being read and extracted from a multi-level cell (MLC) is within an error correcting capability range;
a read voltage control unit configured to either increase or decrease a read voltage applied to the MLC when the number of errors is outside the error correcting capability range;
a codeword determination unit configured to analyze a bit error based on the increase or decrease of the read voltage, and to select a codeword corresponding to the analyzed bit error based on a selected read error pattern; and
a decoding unit configured to decode a codeword for the read word when the number of errors is less than or equal to the error correcting capability range, or to decode the codeword selected by the codeword determination unit, thereby correcting the errors,
wherein the codeword determination unit is configured such that the codeword determination unit analyzes frequency information for the read error pattern, the frequency information includes information indicating a number of times the read error pattern has occurred for each of one or more codewords, and the selected codeword is a codeword for which the number of times the read error pattern has occurred exceeds a reference number of times.

2. The circuit of claim 1, wherein, the codeword determination unit is configured such that when a number of bit errors with respect to the analyzed bit error does not increase or decrease, the codeword determination unit selects the codeword based on the read error pattern.

3. The circuit of claim 1, wherein the codeword determination unit is configured such that the codeword determination unit analyzes a Hamming distance between the read word and the codeword, and the selected codeword is a codeword having a Hamming distance below a reference value.

4. The circuit of claim 3, wherein the MLC stores error pattern information about a weight of the read error pattern including data before encoding, and
the codeword determination unit is configured such that the codeword determination unit selects the codeword based on at least one of the error pattern information and the analyzed Hamming distance.

5. The circuit of claim 1, wherein the read error pattern includes a data error pattern that occurs corresponding to a data storage pattern between adjacent cells of the MLC.

6. The circuit of claim 1, wherein the read error pattern is associated with a data error pattern that occurs due to a lateral electric field between adjacent cells of the MLC.

7. The circuit of claim 6, wherein the data error pattern corresponds to a threshold voltage change of the MLC due to a lateral charge movement caused by the lateral electric field, and
the codeword determination unit is configured such that the codeword determination unit selects the codeword associated with the data error pattern.

8. A memory device comprising:
an MLC array including a plurality of MLCs;
an error correction unit configured to analyze a bit error, when a number of errors in a read word being read and extracted from an MLC is outside an error correcting capability range, and to select and decode a codeword with respect to the read word based on a selected read error pattern; and
a host interface configured to transmit the decoded codeword to a host, wherein the error correction unit includes,
a determination unit configured to determine whether the number of errors exists in the error correcting capability range,
a read voltage control unit configured to either increase or decrease a read voltage applied to the MLC when the number of errors is outside the error correcting capability range,
a codeword determination unit configured to analyze the bit error based on the increase or decrease of the read voltage, and to select the codeword corresponding to the analyzed bit error based on the read error pattern, and
a decoding unit configured to decode a codeword for the read word when the number of errors is less than or equal to the error correcting capability range, or to decode the codeword selected by the codeword determination unit, thereby correcting the errors, and
wherein the codeword determination unit is configured such that the codeword determination unit analyzes frequency information for the read error pattern, the frequency information includes information indicating a number of times the read error pattern has occurred for each of one or more codewords, and the selected codeword is a codeword for which the number of times the read error pattern has occurred exceeds a reference number of times.

9. The memory device of claim 8, wherein the memory device is a Charge Trap Flash (CTF) memory device.

10. An error correction method comprising:
determining whether a number of errors in a word being read and extracted from an MLC is within an error correcting capability range;
either increasing or decreasing a read voltage applied to the MLC when the number of errors is outside the error correcting capability range;
analyzing a bit error based on the increase or decrease of the read voltage, and selecting a codeword corresponding to the analyzed bit error based on a selected read error pattern; and
decoding a codeword for the read word when the number of errors is less than or equal to the error correcting capability range, or decoding the codeword selected by the codeword determination unit, thereby correcting the errors,
wherein the analyzing and selecting includes analyzing frequency information about the read error pattern included in the codeword, and the selected codeword is a codeword for which a number of times the read error pattern has occurred exceeds a reference number of times.

11. The method of claim 10, wherein the analyzing and selecting analyzes a Hamming distance to the read word and the bit error, and the selected codeword is a codeword having a Hamming distance below a reference value.

12. The method of claim 11, wherein the MLC stores error pattern information about a weight of the read error pattern including data before encoding, and
the analyzing and selecting includes selecting the codeword based on at least one of the error pattern information and the analyzed Hamming distance.

13. A non-transitory computer-readable recording medium storing a program for implementing the method of claim 10.

* * * * *